United States Patent [19]

Kitaura et al.

[11] Patent Number: 4,935,175
[45] Date of Patent: Jun. 19, 1990

[54] MOLD CLEANING COMPOSITION, SHEET FOR CLEANING MOLD, AND METHOD FOR CLEANING MOLD USING SAID CLEANING SHEET

[75] Inventors: Toshihiko Kitaura; Akio Nakamura; Masayuki Sakamoto; Kouichi Takashima; Kiyotaka Hirakawa; Matao Mizota, all of Saga, Japan

[73] Assignee: Nitto Electric Industrial Co., Ltd., Osaka, Japan

[21] Appl. No.: 131,791

[22] Filed: Dec. 11, 1987

[30] Foreign Application Priority Data

| Dec. 11, 1986 [JP] | Japan | 61-296198 |
| Dec. 11, 1986 [JP] | Japan | 61-296199 |
| Dec. 23, 1986 [JP] | Japan | 61-313559 |
| Mar. 16, 1987 [JP] | Japan | 62-61478 |
| Jul. 24, 1987 [JP] | Japan | 62-186374 |

[51] Int. Cl.$^5$ .................. B32B 25/02; B32B 25/00
[52] U.S. Cl. .................. 264/39; 106/38.6; 524/156; 428/286
[58] Field of Search .......... 264/39; 524/106; 134/4, 134/8, 22.19; 106/38.6; 428/286

[56] References Cited

U.S. PATENT DOCUMENTS

| 1,929,560 | 10/1933 | Marton | 524/106 |
| 3,476,599 | 11/1969 | Graver et al. | 134/8 |
| 4,670,329 | 6/1987 | Pas | 264/39 |

FOREIGN PATENT DOCUMENTS

| 0004530 | 11/1984 | Int'l Pat. Institute . |
| 52-000788 | 1/1977 | Japan . |
| 58-114932 | 7/1983 | Japan | 264/39 |
| 60-139411 | 7/1985 | Japan | 264/39 |

*Primary Examiner*—Paul Lieberman
*Assistant Examiner*—Kathleen Markowski
*Attorney, Agent, or Firm*—Sughrue, Mion, Zinn, Macpeak & Seas

[57] ABSTRACT

A mold-cleaning composition and sheet comprising an uncured rubber composition comprising an uncured rubber and a curing agent, and at least one removal aid selected from imidazoles and imidazolines, and a method for cleaning a mold using the mold-cleaning sheet, are disclosed. The mold-cleaning sheet is suitably used to clean molding surfaces of a mold or to remove contaminants such as burr formed at peripheries thereof in the continuous production of semiconductor devices by transfer molding.

12 Claims, 2 Drawing Sheets

MOLD CLEANING COMPOSITION, SHEET FOR CLEANING MOLD, AND METHOD FOR CLEANING MOLD USING SAID CLEANING SHEET

FIELD OF THE INVENTION

This invention relates to a mold cleaning composition for cleaning mold such as a mold for molding a thermosetting resin stained by repeated use for molding work, a mold cleaning sheet, and a method for cleaning mold using the cleaning sheet.

More particularly, the invention relates to a mold cleaning composition or a mold cleaning sheet suitable for cleaning the molding surfaces of a mold or burrs formed at the peripheries thereof in the step of continuously producing semiconductor devices by continuously encapsulating a semiconductor element with an epoxy resin composition, etc., by a transfer molding.

BACKGROUND OF THE INVENTION

Semiconductor elements such as transistors, IC, LSI, etc., are usually resin-encapsulated by plastic packaging. Such a resin encapsulation is performed by casting, compression molding, injection molding, transfer molding, etc., in particular by transfer molding excellent in mass producibility and workability, using a thermosetting resin composition such as an epoxy resin composition, etc.

However, when the above-described transfer molding is continuously performed in the case of resin-encapsulating semiconductor elements with an epoxy resin composition by the transfer molding, a problem occurs such that the mold or die for molding is contaminated by a mold releasing agent in the epoxy resin composition, whereby good molding is not performed. That is, in the above molding, a mold releasing agent contained in an epoxy resin composition oozes out from the resin composition onto the inside surface of a cavity formed by the upper mold and the lower mold to cause mold-releasing action, but when the molding is repeated, the mold releasing agent oozed onto the inside surface of the mold is gradually accumulated thereon and deteriorated by being oxidized to form a hard oxidized mold-releasing agent layer (the surface of the layer being not smooth as the inside surface of the mold). Also, the molding is performed on the surface of the oxidized and deteriorated mold-releasing agent layer, whereby the surface pattern of the oxidized and deteriorated mold-releasing agent layer is transferred onto the surface of the molded article to roughen the surface of the molded article and give no gloss, etc. Also, such an oxidized and deteriorated mold-releasing agent layer is once formed on the inside surface of mold, in molding, thereafter, an epoxy resin composition, the mold-releasing agent further oozes out from the resin composition not to the surface of the mold but to the oxidized and deteriorated mold-releasing agent layer, whereby the mold-releasing agent cannot give sufficient mold-releasing action.

For solving these problems, it has hitherto been practiced to introduce a thermosetting melamine resin moldable material into a mold when the oxidized and deteriorated mold-releasing agent layer is formed on the inside surface of the mold, thereby molding and curing the moldable composition, to unify the oxidized and deteriorated mold-releasing agent layer on the surface of the mold and the molded resin article in a unitary body, and then remove the molded article unified with the oxidized and deteriorated mold-releasing agent layer from the mold, whereby the surface of the mold is cleaned.

In this case, however, formalin is by-produced as a condensation product of the thermosetting melamine resin moldable material to emit an offensive odor, which results in reducing working environment and the cleaning workability.

Also, U.S. Pat. No. 4,670,329 discloses a cleaning sheet formed by coating a base with a thermosetting melamine resin moldable material. However, the use of such a cleaning sheet is undesirable since an offensive odor, etc., is emitted by the same reason as above at use.

Furthermore, in U.S. Pat. No. 3,476,599, there is proposed a method of introducing an uncured rubber series compound into the mold having the oxidized and deteriorated mold-releasing agent layer in place of the thermosetting melamine resin moldable material, curing the compound in the mold to form cured rubber, whereby the oxidized and deteriorated mold-releasing agent layer on the surface of the mold is unified with the cured rubber in a unitary body, and removing the cured rubber thus unified with the oxidized and deteriorated mold-releasing agent layer from the mold to clean the surface of the mold.

In this case, for improving the cleaning property, an aminoalcohol shown by the following general formula is added to the compound;

$$NH_2-ALK-OH$$

wherein ALK represents a straight chain or branched alkylene group having from 2 to 5 carbon atoms.

However, since the aminoalcohol is evaporated to emit an odor at curing the uncured rubber series compound, the above-described method also reduces the working environment and cleaning workability.

Also, when semiconductor element encapsulated with a resin by such a transfer molding, a part of the above-described moldable material attaches as burr to the peripheral portion of a cavity formed by an upper mold and a lower mold of the mold or the mold-releasing agent flows out and attaches to the peripheral portion to contaminate the mold.

Thus, it has generally been practiced to remove the contaminants such as burr, etc., attached to the peripheral portion of the cavity of the mold by rubbing the portion with a spatula or a brush and blowing away them by air blowing.

However, it takes a long time to clean the periphery of the molding cavity of mold using a spatula or a brush and also in such a case, a problem occurs such that the contaminants thus removed are scattered in the cavity of the mold to reduce the molding condition.

Also, transfer molding is generally carried out by automatic molding and hence in the above-described case, it is necessary to remove burr, etc., after once stopping the automatic molding operation, which results in reducing the production efficiency of moldings.

SUMMARY OF THE INVENTION

The present invention has been made under such circumstances and an object of this invention is to provide a mold-cleaning composition and a mold-cleaning sheet having good mold-cleaning faculty and emitting no odor.

Other object of this invention is to provide a method for cleaning mold using the cleaning sheet.

A further object of this invention is to provide a mold-cleaning sheet capable of simply and efficiently performing cleaning the inside surface of a mold and removing burr at the peripheral portion of the molding cavity of a mold.

Another object of this invention is to provide a method of cleaning the inside surface of a mold and the peripheral portion of the molding cavity of a mold using the above-described mold-cleaning sheet.

It has now been discovered that the above objects can be attained by the present invention as set forth below.

Thus, according to this invention, there is provided a mold-cleaning composition comprising an uncured rubber, a curing agent, and at least one of imidazoles and imidazolines.

That is, as the result of a series of investigations on the cleaning effect for molds such as a mold for thermosetting resin moldable material, etc., the inventors have discovered that an imidazole and an imidazoline are excellent in compatibility with an uncured rubber and also when a mixture of an imidazole and/or an imidazoline and the uncured rubber is cured in a mold contaminated with an oxidized and deteriorated mold-releasing agent layer, the contaminant components on the surface of the mold smoothly transfer into the cured rubber and hence by removing the cured rubber composition from the mold, the surface of the mold can be easily cleaned.

In this case, at curing the uncured rubber composition, neither formalin-like odor nor amine-like odor is emitted and hence no problem of reducing the working environment occurs.

The mold-cleaning composition of this invention is obtained by using an uncured rubber composition containing an uncured rubber and a curing agent, and at least one of imidazoles and imidazolines. The composition obtained by mixing both components is usually used as a sheet form.

DETAILED DESCRIPTION OF THE INVENTION

Figure 1:
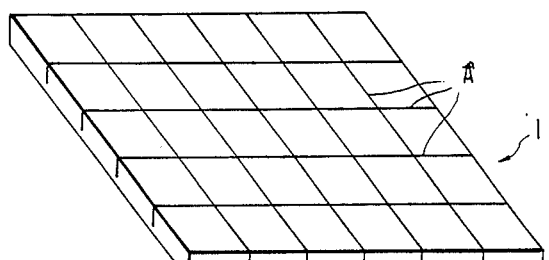
FIG. 1 is a slant view of an example of the mold-cleaning composition sheet of this invention.

Then, the invention is explained below in detail.

As the uncured rubber for use in this invention, natural rubber (NR), chloroprene rubber (CR), butadiene rubber (BR), nitrile rubber (NBR), ethylene-propylene terpolymer rubber (EPT), ethylene-propylene rubber (EPM), styrene-butadiene rubber (SBR), polyisoprene rubber (IR), butyl rubber (IIR), silicone rubber (Q), fluorinated rubber (FKM), etc., are used as the main component thereof singly or as a mixture thereof.

The uncured rubber is cured in a mold to provide cured rubber.

In the above-described uncured rubbers, EPT, SBR, NBR, or a mixture thereof is preferred in this invention.

EPT is a cyclic or acyclic copolymer having ethylene, α-olefin, and non-conjugated double bond.

Then, EPT is explained in detail. EPT is a terpolymer composed of ethylene, an α-olefin (particularly, propylene), and a polyene monomer as illustrated below. Examples of the polyene monomer are dicyclopentadiene, 1,5-cyclooctadiene, 1,1-cyclooctadiene, 1,6-cyclododecadiene, 1,7-cyclododecadiene, 1,5,9-cyclododecatriene, 1,4-cycloheptadiene, 1,4-cyclohexadiene, norbornadiene, methylene-norbornene, 2-methylpentadiene-1,4, 1,5-hexadiene, 1,6-heptadiene, methyl-tetrahydroindene, 1,4-hexadiene, etc.

The copolymerization ratio in the above-described terpolymer is preferably from 30 to 80 mol % ethylene, from 0.1 to 20 mol % polyene, and rest being α-olefin. The terpolymer containing from 30 to 60 mol % ethylene is more preferred. Also, the terpolymer having Mooney viscosity $ML_{1+4}$ (100° C.) of from 20 to 70 is preferred. Specific examples of the above-described EPT are Mitsui EPT 4021, Mitsui EPT 4045, and Mitsui EPT 4070 (trade names, made by Mitsui Petrochemical Industries, Ltd.).

Also, SBR having a styrene content of from 15 to 30 mol % and a Mooney viscosity $ML_{1+4}$ (100° C.) of from 20 to 80, preferably from 35 to 60, is suitably used in this invention. Specific examples of such SBR are JSR-1502, JSR-1507, and JSR-1778 (trade names, made by Japan Synthetic Rubber Co., Ltd.).

NBR having an acrylonitrile content of from 20 to 60 mol %, preferably from 25 to 45 mol %, and a Mooney viscosity $ML_{1+4}$ (100° C.) of from 20 to 85, preferably from 30 to 70, is suitably used in this invention. Specific examples of such NBR are N-234L, N-230S, and N-230SH (trade names, made by Japan Synthetic Rubber Co., Ltd.).

The curing agent for use in this invention is, for example, an organic peroxide such as ketone peroxide, peroxy ketal, hydroperoxide, dialkyl peroxide, diacyl peroxide, peroxy ester or peroxy dicarbonate.

The amount of such a curing agent is usually from 1 to 10 parts by weight, preferably from 1.5 to 6 parts by weight, per 100 parts by weight of the uncured rubber.

In this invention, the curing agent containing, in particular, a peroxyketal represented by formula (1)

wherein $R_1$, $R_2$, $R_3$, and $R_4$, which may be the same or different, each represents a hydrogen atom or a monovalent hydrocarbon group.

By using such a curing agent, the curing rate for the uncured rubber can be accelerated, whereby cleaning of a mold can be performed in a short period of time.

Examples of the peroxyketal shown by formula (1) described above are 1,1-bis(t-butylperoxy)-3,3,5-trimethylcyclohexane, 1,1-bis(t-butylperoxy)cyclohexane, 2,2-bis(t-butylperoxy)octane, n-butyl-4,4-bis(t-butylperoxy)valerate, 2,2-bis(t-butylperoxy)butane, etc.

The amount of the peroxyketal is usually from 1 to 10 parts by weight, preferably from 1.5 to 6 parts by weight, per 100 parts by weight of the uncured rubber.

The peroxyketal may be used as it is or as a mixture with an organic solvent such as dimethyl phthalate, dimethylformamide, toluene, xylene, dioctyl phthalate, methyl ethyl ketone, etc., to improve the dispersibility thereof in the uncured rubber. In this case, the amount of the organic solvent is generally 50 parts by weight or less, and most generally 20 parts by weight or less, per 100 parts by weight of the peroxyketal.

In this invention, at least one of imidazoles and imidazolines is used as a removal aid.

As the imidazoles, an imidazole represented by formula (2) can be used with good results;

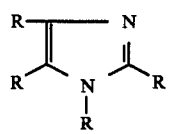
(2)

wherein R represents a hydrogen atom or a hydrocarbon group having less than 11 carbon atoms, which may have a substituent, and said Rs may be the same or different.

Typical examples of these imidazoles are 2-methylimidazole, 2-ethyl-4-methylimidazole, 2-phenylimidazole, 1-benzyl-2-methylimidazole, 2,4-diamino-6[2'-methylimidazolyl-(1)']ethyl-s-triazine, 2,4-diamino-6[2'-ethyl-4'-methylimidazolyl-(1)']ethyl-s-triazine, etc.

Also, as the imidazolines, an imidazoline represented by following formula (3) can be used with good results;

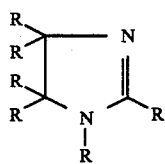
(3)

wherein R represents a hydrogen atom or a hydrocarbon group having less than 11 carbon atoms, which may have a substituent, and said Rs may be the same or different.

Typical examples of such an imidazoline are 2-methylimidazoline, 2-methyl-4-ethylimidazoline, 2-phenylimidazoline, 1-benzyl-2-methylimidazoline, 2-phenyl-4-methyl-5-hydroxymethylimidazoline, 2,4,-diamino-6[2'-methylimidazolyl-(1)']ethyl-s-triazine, 2,4-diamino-6[2'-methyl-4'-ethylimidazolyl-(1)']ethyl-s-triazine, 1-cyanethyl-2-methylimidazoline, 1-cyanoethyl-2-methyl-4-ethylimidazoline, etc.

The removal aid can be used in an amount of usually from 5 to 20% by weight, and preferably from 7 to 15% by weight, to the total amount of the whole composition.

The removal aid can be used as it is or as a mixture with water, an alcohol such as methanol, ethanol, n-propanol, etc., or an organic solvent such as toluene, xylene, etc., for improving the dispersibility thereof in the composition. In the case of using the removal aid with an organic solvent, etc., the amount of the organic solvent, etc., is usually 50 parts by weight or less, and most generally 20 parts by weight or less, per 100 parts by weight of the removal aid.

By using such a removal aid, the occurrence of a formalin-like odor and an amine-like odor can be prevented and hence no problem of reducing the working environment occurs.

The mold-cleaning composition of this invention may further contain, if necessary, a mold-releasing agent. The amount thereof is usually less than 5% by weight, most preferably less than 3% by weight, of the amount of the whole composition. If the amount of the mold-releasing agent is too much, the cleaning effect is undesirably reduced. When a mold-releasing agent exists in the mold-releasing composition of this invention, the mold-releasing agent can be attached to the surface of the mold thus cleaned, whereby the subsequent molding can be ordinary performed immediately after cleaning.

Examples of the mold-releasing agent for use in this invention are stearic acid, zinc stearate, carnauba wax, montan wax, stearyl ethylenediamide, partially saponified esteric wax, etc.

In addition, the mold-cleaning composition of this invention can further contain an inorganic reinforcing agent (filler) such as silica, alumina, calcium carbonate, aluminum hydroxide, titanium oxide, etc. In this case, the amount of the reinforcing agent is suitably selected in the range of from 10 to 80 parts by weight per 100 parts by weight of the uncured rubber.

In an embodiment of this invention, the mold-cleaning composition of this invention described above is usually used in a form of sheet having a desired thickness by kneading the above-described components by a kneading roll, etc., at temperature of from 70° to 150° C. and then fabricating the kneaded mixture into a sheet using a press roll, etc. The thickness of the cleaning sheet of the mold-cleaning composition of this invention is usually from 2 to 10 mm, and preferably from 3 to 7 mm.

Also, in another embodiment of this invention, the mold-cleaning sheet of this invention is composed of a fibrous base sheet and the uncured rubber composition.

The cleaning sheet of this embodiment is suitably used for removing decontaminants such as burr, etc., at the pheripheral portion of the molding cavity of a mold.

As the sheet-form fibrous base for use in this invention, there are various kinds of nonwoven fabrics, e.g., organic fibrous nonwoven fabrics such as polyester nonwoven fabrics, etc., and inorganic nonwoven fabrics such as glass fiber nonwoven fabrics, etc., cellulose-mixed glass papers, papers, etc. As the case may be, woven fabrics may be used in place of the nonwoven fabrics.

Practical examples of the above-described nonwoven fabrics are Aiel E1030, Aiel E1050, and Aiel E1100 (trade name, made by Asahi Chemical Industry Co., Ltd.) as the nonwoven fabrics composed of polyester fibers, D-3038 and D-3042 (trade names, made by Itochu Shoji K.K.) as staple fiber victoria lawns, and also WK-3025A-104, WL-110B, and KC-0808B-104-AB1 (trade name, made by Unitika Ltd.).

The thickness of such a sheet-form fibrous base is usually from 0.1 to 0.5 mm, and preferably from 0.2 to 0.3 mm.

The uncured rubber composition which is formed on one surface or both surfaces of the sheet-form fibrous base in layer is cured by heating at the joints of a mold at cleaning work to form cured rubber. In this case, the cured rubber is unified with contaminants attached to the peripheral portion of the joints, etc., of the mold and the contaminants are removed from the peripheral portion of the mold by removing the cleaning sheet from the mold. The uncured rubber composition for use in this invention contains an uncured rubber and a curing agent.

The uncured rubber and the curing agent as well as the amounts of them are same as described above.

Also, the uncured rubber composition described above may further contain, if necessary, at least one of an imidazole and an imidazoline as in the above-described case as a removal aid.

Also, the uncured rubber composition may further contain, if necessary, a mold-releasing agent as described above.

The mold-cleaning sheet for cleaning the peripheral portion of the molding cavity of mold can be prepared by kneading a mixture of the uncured rubber composition and, if necessary, a removal aid, a mold-releasing agent, a reinforcing agent, etc. by a kneading roll at 70° C. to 150° C. to form a thin sheet, superposing the sheet on a sheet-form fibrous base material, and pressing the assembly by mean of a calender roll to unify them. The thickness of the cleaning sheet is usually from 0.2 to 1 mm, and preferably from about 0.3 to 0.6 mm.

In addition, both the cleaning sheets composed of the uncured rubber composition described above preferably have the total content of chlorine ions and sodium ions of 2,000 ppm or less. This is because, if the content of the ions is high, at cleaning the surface of a transfer mold by the cleaning sheet, the chlorine ions and the sodium ions existing in the cleaning sheet remain on the inside surface of the mold, which causes a possibility of introducing these ionic impurities into the semiconductor devices obtained. If the above-described ionic impurities exist the semiconductor device, large problem occurs in the point of reliability such as humidity resting reliability. However, in the case of preparing the cleaning composition composed of the uncured rubber composition, it is desired to sufficiently select raw materials for using them containing no or less ionic impurities.

On the surface of both the cleaning sheets, i.e., the mold-cleaning composition sheet and the cleaning sheet for cleaning the peripheral portion of the molding cavity of a mold described above may form cutting marks of definite intervals for cutting the sheet into pieces of definite size. By forming such cutting marks, the cleaning sheet can be easily cut at the mark, whereby the cleaning sheet can be accurately and simply cut as compared with cutting it by eye measure.

Figure 2:
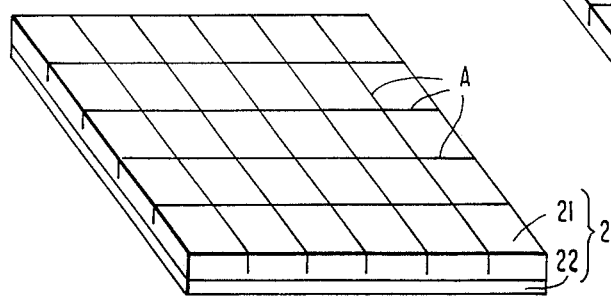
FIG. 2 is a slant view of an example of the cleaning sheet of this invention for cleaning the periphery of the molding cavity of a mold.

There is not particular restriction on the form of the cutting marks if the cutting marks have the above-described function but as shown in FIG. 1 and FIG. 2, cutting marks A can be formed in a sheet 1 or 2 by forming cut. Also, the cutting marks may be formed by printing, etc., and the cleaning sheet may be cut along the cutting marks by a knife, etc.

Now, FIG. 1 is a slant view showing an example of the mold-cleaning composition sheet of this invention and FIG. 2 is a slant view showing an example of the cleaning sheet for cleaning the peripheral portion of the molding cavity of mold of this invention, wherein the sheet 2 is composed of an uncured rubber composition 21 and a sheet-form fibrous base material 22.

The form of the cutting marks of the cleaning sheet is not only squares as shown in FIG. 1 and FIG. 2 but also may be parallel lines in a definite direction, or marks in the peripheral portion only of the sheet with a definite interval. In addition, when the cutting marks are formed with a definite interval, the cutting marks function as a measure.

Also, for distinguishing the above-described two kinds of the cleaning sheets of this invention for use, it is suitable to color each sheet with a different color.

Then, the method of using both the cleaning sheets of this invention is explained.

The mold-cleaning composition sheet of this invention is inserted between both surfaces of a mold followed by heating and pressing to cure the composition and the cured sheet is removed from the mold, whereby the oxidized and deteriorated mold-releasing agent layer formed at the surfaces of the mold transferred into the sheet are removed together with the sheet and the surfaces of the mold can be cleaned.

Then, the using method of the cleaning sheet is explained in detail by referring to the accompanying drawings.

Figure 3:
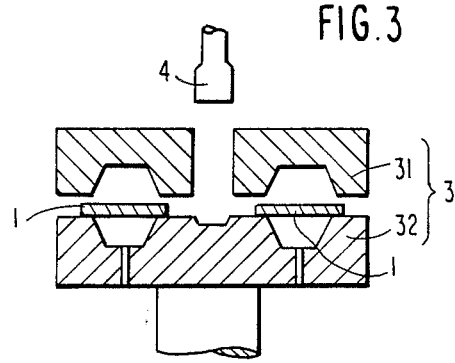
FIG. 3 to FIG. 5 are views for explaining a method for cleaning a mold using the mold cleaning composition sheet of this invention.
Figure 4:
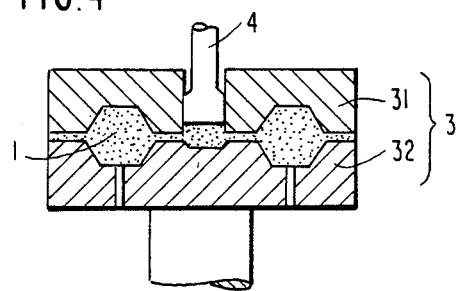
Figure 5:
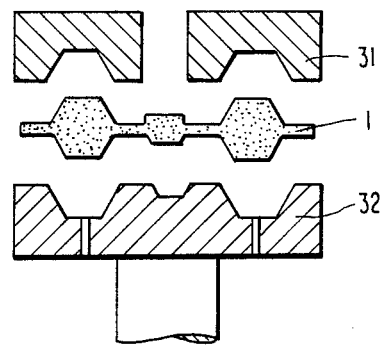

As shown in FIG. 3, the mold-cleaning composition sheets 1, 1 cut in conformity with the size of a mold 3 are placed between each of an upper mold 31 and a lower mold 32. Then, the mold is closed leaving a gap of from about 1 mm to 3 mm between the upper and lower molds and the cleaning composition sheet is cured at temperature of usually from 60° C. to 200° C. for 5 to 10 minutes while pressing the mold by means of a plunger 4 as shown in FIG. 4. After curing, the mold 3 and the plunger 4 are opened and the cured sheet 1 is removed from the mold as shown in FIG. 5.

Also, the cleaning sheet for cleaning the peripheral portion of the molding cavity of a mold of this invention can be used by the same manner as described above and by the manner, contaminants such as burr, etc., attached to the peripheral portion of the molding section or cavity of a mold can be removed together with the cleaning sheet in a unitary body to clean the peripheral portion of the molding cavity of the mold.

The using method of the sheet is explained based on the accompanying drawings.

Figure 6:
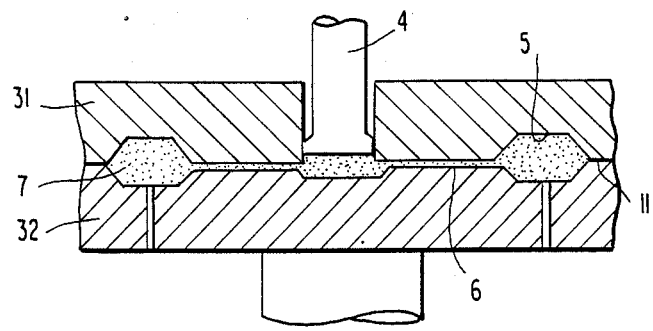
FIGS. 6 and 7 are views for explaining the state of burr attached to the peripheral portion of the molding cavity of a mold.
Figure 7:
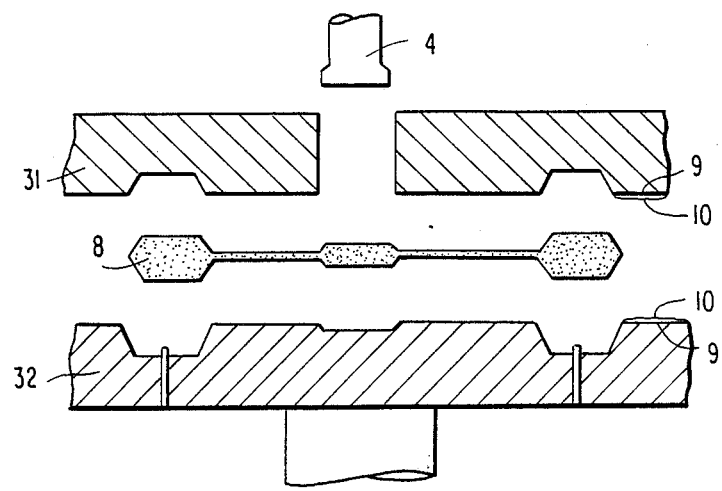
Figure 8:
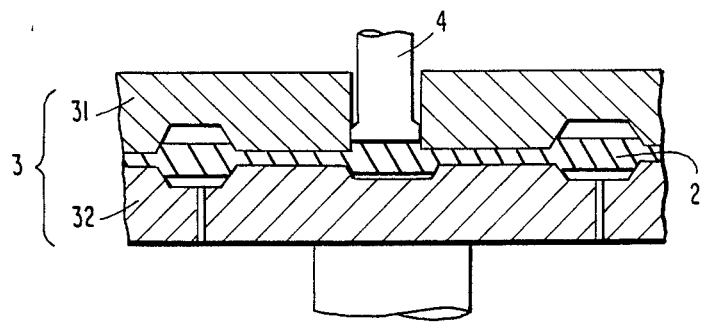
FIG. 8 is a view for explaining the using state of the mold-cleaning sheet of this invention for cleaning the peripheral portion of the molding cavity of a mold.

As shown in FIG. 6, a molten epoxy resin moldable material 7 is pressed in a cavity 5 formed by upper molds 31 and a lower mold 32 through a lanner 6 by the pressing force of a plunger 4 followed by molding, the mold is opened and the molded article 8 is withdrawn from the mold as shown in FIG. 7. In this case, burr 10 remains at the periphery of the cavity, such as the joint 9 of the mold. Numeral 11 is an air bent. The cleaning sheet 2 of this invention for cleaning the peripheral portion of the molding cavity of mold is inserted between the upper molds 31 and the lower mold 32 having burr at the peripheral portions as shown in FIG. 8 and the sheet is cured for 3 to 10 minutes at temperature of usually from about 175° C. to 195° C. After curing, the mold 3 is immediately opened and the cured cleaning sheet 2 is removed.

By this method, contaminants such as burr 10, etc., can be removed together with the sheet in an unitary body.

In the continuous production of semiconductor devices by continuously encapsulating semiconductor elements with resin by transfer molding, after cleaning the surfaces of mold using mold-cleaning sheet of this invention, the transfer molding can be further continuously performed to produce semiconductor devices. In this case, there is no restriction on the material for encapsulating semiconductor elements but the mold-cleaning sheet of this invention is particularly effective in the case of using a novolac type epoxy resin as a material for encapsulating semiconductor elements.

As described above in detail, since the mold-cleaning composition sheet of this invention has the above-described constitution, the oxidized and deteriorated mold-releasing agent layer and/or other contaminants formed on the surfaces of mold are transferred into the cleaning composition itself and the surfaces of the mold can be very simply and effectively cleaned. In this case, the cleaning sheet does not generate a formalin-like odor or an amine-like odor, and hence the working environment is not reduced at the cleaning operation.

Also, by inserting the cleaning sheet of this invention for cleaning the peripheral portion of the molding cavity of mold between upper and lower molds of a mold followed by heating for curing the sheet, contaminants such as burr, etc., attached to the peripheral portion of the molding cavity of mold, such as point of the mold can be easily unified with the cured cleaning sheet itself and can be easily removed from the peripheral portion of the molding section by opening the mold and removing the cured sheet.

The both cleaning sheets of this invention can removed contaminants attached to the inside surfaces of a mold or attached to the peripheral portions of the molding cavity of the mold in the case of continuously molding a thermosetting resin moldable material by a simple operation that the cleaning sheet is inserted between the upper and lower molds per 50 to 100 shots following by heating to cure the sheet and the cured sheet is removed by opening the mold. In this case, no offensive odor is emitted and hence the working environment is not reduced.

Then, the invention is further explained in more practically by the following examples and comparison examples.

EXAMPLE 1

After kneading a mixture of 100 parts (by weight) of ethylene propylene terpolymer rubber (EPT), Mitsui EPT 4045 (trade name, made by Mitsui Petrochemical Industries, Ltd.), 20 parts of silica powder, 5 parts of titanium oxide, 4 parts of an organic peroxide, 1 part of stearic acid, and 3 parts of 2-ethyl-4-methylimidazole by means of a kneading roll at 90° C., the kneaded mixture was molded into a sheet of 7 mm in thickness using a press roll to provide a desired mold-cleaning composition sheet.

EXAMPLES 2 AND 3

By following the same procedure as in Example 1 except that the amount of 2-ethyl-4-methylimidazole was changed to 20 parts and 50 parts, respectively, desired mold-cleaning composition sheets were obtained.

EXAMPLES 4 AND 5

By following the same procedure as in Example 1 except that 3 parts and 20 parts, respectively, of 2,4-diamino-6[2'-methylimidazolyl-(1)']ethyl-s-triazine (hereinafter, is referred to as "2MZ-AZINE") was used in place of 2-ethyl-4-methylimidazole, sheet-form mold-cleaning compositions were obtained.

EXAMPLE 6

By following the same procedure as in Example 1 except that 10 parts of 2MZ-AZINE and 10 parts of 1-cyanoethyl-2-methylimidazole were used together in place of 2-ethyl-4-methylimidazole, a sheet-form mold-cleaning composition was obtained.

EXAMPLES 7 AND 8

By following the same procedure as in Example 1 except that 100 parts of styrene butadiene rubber (SBR), JSR-1502 (trade name, made by Japan Synthetic Rubber Co., Ltd.) was used in place of ethylene-propylene terpolymer rubber and 5 parts and 20 parts each of 2-methylimidazoline was used in place of 2-ethyl-4-methylimidazole, sheet-form mold-cleaning compositions were obtained.

EXAMPLES 9 AND 10

By following the same procedure as in Example 1 except that a half amount of ethylene-propylene terpolymer rubber was replaced with the styrene butadiene rubber and 5 parts and 20 parts each of 2-phenyl imidazoline was used in place of 2-ethyl-4-methylimidazole, sheet-form mold-cleaning compositions were obtained.

EXAMPLE 11

By following the same procedure as in Example 1 except that 50 parts of the styrene butadiene rubber and 50 parts of nitrile rubber (NBR), N-230SH (trade name, made by Japan Synthetic Rubber Co., Ltd.) were used in place of ethylene-propylene terpolymer rubber and also 10 parts of 1-cyanoethyl-2-methylimidazole and 10 parts of 1-cyanoethyl-2-methyl-4-ethylimidazoline were used in place of 2-ethyl-4-methylimidazole, a sheet-form mold-cleaning composition was obtained.

COMPARISON EXAMPLE 1

By following the same procedure as in Example 1 except that 2-amino-2-methyl-1-propanol was used in place of 2-ethyl-4-methylimidazole, a sheet-form mold-cleaning composition was obtained.

COMPARISON EXAMPLE 2

By following the same procedure as in Example 3 except that toluene was used in place of 2-ethylimidazole, a sheet-form mold-cleaning composition was obtained.

COMPARISON EXAMPLE 3

By following the same procedure as in Example 4 except that diisopropyl ketone was used in place of 2-ethyl-4-methylimidazole, a sheet-form mold-cleaning composition was obtained.

EXAMPLE 12

By following the same procedure as in Example 1 except that a peroxy ketal, 1,1-bis(t-butylperoxy)-3,3,5-trimethylcyclohexane, was used in place of the organic peroxide, a sheet-form mold-cleaning composition was obtained.

EXAMPLE 13

By following the same procedure as in Example 12 except that 1,1-bis(t-butylperoxy)cyclohexane was used in place of the peroxy ketal as curing agent, a sheet-form mold-cleaning composition was obtained.

EXAMPLE 14

By following the same procedure as in Example 12 except that 2,2-bis(t-butylperoxy)octane was used in place of peroxy ketol as a curing agent, a sheet-form mold-cleaning composition was obtained.

EXAMPLE 15

By following the same procedure as in Example 12 except that 10 parts of 2,4-diamino-6[2'-methylimidazolyl(1)']ethyl-s-triazine (2MZ-AZINE) and 10 parts of 1-cyanoethyl-2-methylimidazole were used together in place of 2-ethyl-4-methylimidazole and also 4 parts of 2,2-bis(t-butylperoxy)valerate was used as a peroxy ketal (a curing agent), a sheet-form mold-cleaning composition was obtained.

EXAMPLE 16

By following the same procedure as in Example 12 except that 100 parts of styrene butadiene rubber (SBR), JSR-1502 (trade name, made by Japan Synthetic Rubber Co., Ltd) was used in place of ethylene-propylene terpolymer rubber, 20 parts of 2-methylimidazoline was used in place of 2-ethyl-4-methylimidazole, and 2 parts of 2,2-bis(t-butylperoxy)butane and 2 parts of dicumyl peroxide were used together as a peroxy ketal (curing agent), a sheet-form mold-cleaning composition was obtained.

Each of the sheet-form mold-cleaning compositions obtained in Examples 1 to 16 and Comparison Examples 1 to 3 was inserted between the upper and lower molds of a mold for molding thermosetting resin having an oxidized and deteriorated mold-releasing agent layer formed on the surfaces thereof with a clearance of 2 mm, cured for 4 minutes at 175° C., the mold was immediately open after curing the sheet, and the cured sheet was removed. In this case, the cleaned state of the surface of the mold and the reduction of working environment caused of odor were observed and the results obtained are summarized in Tables 1 and 2 below.

TABLE 1

| Components: (parts by weight) | Example 1 | 2 | 3 | 4 | 5 | 6 | 7 |
|---|---|---|---|---|---|---|---|
| EPT | 100 | 100 | 100 | 100 | 100 | 100 | — |
| SBR | — | — | — | — | — | — | 100 |
| NBR | — | — | — | — | — | — | — |
| Silica powder | 20 | 20 | 20 | 20 | 20 | 20 | 20 |
| Titanium oxide | 5 | 5 | 5 | 5 | 5 | 5 | 5 |
| Organic peroxide | 4 | 4 | 4 | 4 | 4 | 4 | 4 |
| Stearic acid | 1 | 1 | 1 | 1 | 1 | 1 | 1 |
| 2-Ethyl-4-methylimidazole | 3 | 20 | 50 | — | — | — | — |
| 2MZ-AZINE[*1] | — | — | — | 3 | 20 | 10 | — |
| 1-Cyanoethyl-2-methylimidazole | — | — | — | — | — | 10 | — |
| 2-Methylimidazoline | — | — | — | — | — | — | 5 |
| 2-Phenylimidazoline | — | — | — | — | — | — | — |
| 1-Cyanoethy-2-methyl-4-ethylimidazoline | — | — | — | — | — | — | — |
| 2-Amino-2-methyl-1-propanol | — | — | — | — | — | — | — |
| Toluene | — | — | — | — | — | — | — |
| Diisopropyl ketone | — | — | — | — | — | — | — |
| Mold-cleaning property | Good | Good | Good | Good | Good | Good | Good |
| Cleaning workability (odor) | None | None | None | None | None | None | None |
| Curing rate (min.) | 4.5 | 4.5 | 4.5 | 4.5 | 4.5 | 4.5 | 4.5 |

| Components: (parts by weight) | Example 8 | 9 | 10 | 11 | Comparison Example 1 | 2 | 3 |
|---|---|---|---|---|---|---|---|
| EPT | — | 50 | 50 | — | 100 | — | — |
| SBR | 100 | 50 | 50 | 50 | — | 100 | — |
| NBR | — | — | 100 | 50 | — | — | 100 |
| Silica powder | 20 | 20 | 20 | 20 | 20 | 20 | 20 |
| Titanium oxide | 5 | 5 | 5 | 5 | 5 | 5 | 5 |
| Organic peroxide | 4 | 4 | 4 | 4 | 4 | 4 | 4 |
| Stearic acid | 1 | 1 | 1 | 1 | 1 | 1 | 1 |
| 2-Ethyl-4-methylimidazole | — | — | — | — | — | — | — |
| 2MZ-AZINE[*1] | — | — | — | — | — | — | — |
| 1-Cyanoethyl-2-methylimidazole | — | — | — | 10 | — | — | — |
| 2-Methylimidazoline | 20 | — | — | — | — | — | — |
| 2-Phenylimidazoline | — | 5 | 20 | — | — | — | — |
| 1-Cyanoethyl-2-methyl-4-ethylimidazoline | — | — | — | 10 | — | — | — |
| 2-Amino-2-methyl-1-propanol | — | — | — | — | 20 | — | — |
| Toluene | — | — | — | — | — | 20 | — |
| Diisopropyl ketone | — | — | — | — | — | — | 20 |
| Mold-cleaning property | Good | Good | Good | Good | Good | Poor | Poor |
| Cleaning workability (odor) | None | None | None | None | Odored | None | None |
| Curing rate (min.) | 4.5 | 4.5 | 4.5 | 4.5 | 4.5 | 4.5 | 4.5 |

[*1] 2,4-Diamino-6 2'methylimidazolyl-(1)'ethyl-s-triazine

TABLE 2

| Components: (parts by weight) | Example 12 | 13 | 14 | 15 | 16 |
|---|---|---|---|---|---|
| EPT | 100 | 100 | 100 | 100 | — |
| SBR | — | — | — | — | 100 |
| NBR | — | — | — | — | — |
| Silica powder | 20 | 20 | 20 | 20 | 20 |
| Titanium oxide | 5 | 5 | 5 | 5 | 5 |
| Curing agent (peroxy ketol) | 4 | 4 | 4 | 4 | 4 |
| Stearic acid | 1 | 1 | 1 | 1 | 1 |
| 2-Ethyl-4-methylimidazole | 3 | 3 | 3 | — | — |
| 2MZ-AZINE[*1] | — | — | — | 10 | — |
| 1-Cyanoethyl-2-methyl imidazole | — | — | — | 10 | — |
| 2-Methylimidazoline | — | — | — | — | 20 |

TABLE 2-continued

| Components: (parts by weight) | Example | | | | |
|---|---|---|---|---|---|
| | 12 | 13 | 14 | 15 | 16 |
| 2-Phenylimidazoline | — | — | — | — | — |
| 1-Cyanoethyl-2-methyl-4-ethylimidazoline | — | — | — | — | — |
| 2-Amino-2-methyl-1-propanol | — | — | — | — | — |
| Toluene | — | — | — | — | — |
| Diisopropyl ketone | — | — | — | — | — |
| Ethanol | — | — | — | — | — |
| Mold-cleaning property | Good | Good | Good | Good | Good |
| Curing rate (min.) | 2.0 | 2.0 | 2.0 | 2.0 | 2.5 |

As is clear from the results shown in each table, it can be seen that in the examples of this invention, the oxidized and deteriorated mold-cleaning agent layer attached on the surface of the mold was transferred onto the surface of the cured sheet removed from the mold for molding thermosetting resin, whereby the cavity surface of the mold was cleaned. Also, in the cleaning work, no odor was emitted and there was no problem on the cleaning work. On the other hand, in the case of the comparison examples, there was problem on the mold cleaning property or the occurrence of offensive odor and good results were not obtained.

EXAMPLE 17

After kneading 100 parts (by weight) of ethylenepropylene terpolymer rubber (EPT), Mitsui EPT 4045 (trade name, made by Mitsui Petrochemical Industries, Ltd.), 20 parts of silica powder, 5 parts of titanium oxide, 4 parts of an organic peroxide, and 1 part of stearic acid by a kneading roll at 95° C., the uncured rubber composition and a nonwoven fabric (thickness is 0.25 mm), Aiel E1050 (trade name, made by Asahi Chemical Industry Co., Ltd.) were molded into a sheet form of 0.4 mm in thickness using calender roll to provide a desired cleaning sheet for cleaning the peripheral portion of the molding cavity of mold.

EXAMPLE 18

By following the same procedure as in Example 17 except that a staple fiber victoria lawn (thickness is 0.27 mm), D-3038 (trade name, made by Itochu Shoji K.K.) were used in place of the nonwoven fabric, a cleaning sheet for molding the peripheral portion of the molding cavity of mold having a thickness of 0.5 mm was obtained.

EXAMPLE 19

By following the same procedure as in Example 17 except that 100 parts of styrene butadiene rubber (SBR), JSR-1502 (trade name, made by Japan Synthetic Rubber Co., Ltd.), 20 parts of silica powder, 15 parts of aluminum hydroxide, 4 parts of an organic peroxide, and 1 part of zinc stearate were used, a cleaning sheet for cleaning the peripheral portion of the molding cavity of mold having a thickness of 0.6 mm was obtained.

EXAMPLE 20

By following the same procedure as in Example 17 except that 100 parts of nitrile rubber (NBR), N=230SH (trade name, made by Japan Synthetic Rubber Co., Ltd.), 20 parts of silica powder, 5 parts of titanium oxide, 4 parts of an organic peroxide, and 1 part of stearic acid were used, a cleaning sheet for cleaning the peripheral portion of the molding cavity of mold having a thickness of 0.9 mm was obtained.

EXAMPLE 21

By following the same procedure as in Example 17 except that EPT was used together with SBR as used in Example 19 at 50:50 by weight ratio, a cleaning sheet for cleaning the peripheral portion of the molding cavity of mold having a thickness of 0.8 mm was obtained.

COMPARISON EXAMPLE 4

By following the same procedure as in Example 17 except that a thermosetting epoxy resin was used in place of the uncured rubber composition, a cleaning sheet for cleaning the peripheral portion of the molding cavity of mold was obtained.

COMPARISON EXAMPLE 5

By following the same procedure as in Example 17 except that a thermosetting phenol resin was used in place of the uncured rubber composition, a cleaning sheet for cleaning the peripheral portion of the molding cavity of mold was obtained.

Each of the cleaning sheets obtained in Examples 17 to 21 and Comparison Examples 4 and 5 was used for cleaning the peripheral portion of the molding cavity of mold as shown in FIG. 8. Then, the cleaned state at the peripheral portion of the molding cavity of the mold was observed and the results obtained are summarized in Table 3.

TABLE 3

| | Example | | | | | Comparison Example | |
|---|---|---|---|---|---|---|---|
| | 17 | 18 | 19 | 20 | 21 | 4 | 5 |
| Component (parts by weight) | | | | | | | |
| EPT | 100 | 100 | — | — | 50 | — | — |
| SBR | — | — | 100 | — | 50 | — | — |
| NBR | — | — | — | 100 | — | — | — |
| Silica powder | 20 | 20 | 20 | 20 | 20 | — | — |
| Titanium oxide | 5 | 5 | 5 | 5 | — | — | — |
| Aluminum hydroxide | — | — | 15 | — | — | — | — |
| Stearic acid | 1 | 1 | — | 1 | 1 | — | — |
| Zinc stearate | — | — | 1 | — | — | — | — |
| Organic peroxide | 4 | 4 | 4 | 4 | 4 | — | — |
| Epoxy resin | — | — | — | — | — | 100 | — |
| Phenol resin | — | — | — | — | — | — | 100 |
| Base material | Nonwoven Fabric | Staple Fiber Victoria | Nonwoven Fabric | Nonwoven Fabric | Nonwoven Fabric | Nonwoven Fabric | Nonwoven Fabric |
| Mold-cleaning | Good | Good | Good | Good | Good | Poor | Poor |

TABLE 3-continued

| | Example | | | | | Comparison Example | |
|---|---|---|---|---|---|---|---|
| | 17 | 18 | 19 | 20 | 21 | 4 | 5 |
| property* | | | | | | | |

*Good: Peripheral portion of the mold is cleaned to the original mirror-plane state.
Poor: Contaminants (burr) remain without being removed.

As is clear from the results shown in Table 3 above, it can be seen that in the examples of this invention, the peripheral portion of the molding cavity of mold could be cleaned to the initial mirror surface state, while in the comparison examples, burr at the peripheral portion of the molding cavity of the mold was not removed and the portion was not cleaned to the initial state.

While the invention has been described in detail and with reference to specific embodiments thereof, it will be apparent to one skilled in the art that various changes and modifications can be made therein without departing from the spirit and scope thereof.

What is claimed is:

1. A method for cleaning the surface of a mold, comprising the steps of:
   (a) inserting a mold-cleaning sheet comprising an uncured rubber composition and at least one removal aid selected from imidazoles and imidazolines between the molding surfaces of a mold;
   (b) heating and pressing the sheet to cure the sheet; and
   (c) removing the cured sheet from the molding surfaces of the mold,
   wherein said imidazole is represented by formula (2) and said imidazoline is represented by formula (3):

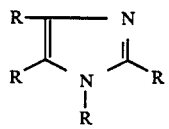

(2)

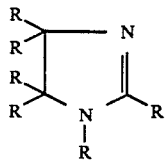

(3)

wherein R represents a hydrogen atom or a hydrocarbon group having less than 11 carbon atoms which may have a substituent, and said R's may be the same or different.

2. A method for cleaning the surface of a mold as claimed in claim 1, wherein the removal aid is compounded in an amount of from 5 to 20% by weight based on the weight of the whole composition.

3. A method for cleaning the surface of a mold as claimed in claim 1, wherein from 1 to 10 parts by weight of the curing agent is compounded per 100 parts by weight of the uncured rubber.

4. A method for cleaning the surface of a mold as claimed in claim 1, wherein the curing agent contains a peroxy ketal represented by formula (1)

(1)

where $R_1$, $R_2$, $R_3$, and $R_4$, which may be the same or different, each represents a hydrogen atom of a monovalent hydrocarbon group.

5. A method for cleaning the surface of a mold as claimed in claim 1, wherein the composition further contains a mold-releasing agent in an amount of less than 5% by weight based on the weight of the whole composition.

6. A method for cleaning the surface of a mold as claimed in claim 1, wherein said imidazoles and imidazolines are selected from the group consisting of 2-methylimidazole, 2-ethyl-4-methylimidazole, 2-phenylimidazole, 1-benzyl-2-methylimidazole, 2,4-diamino-6[2'-methylimidazolyl-(1)']ethyl-s-triazine, 2,4-diamino-6[2'-ethyl-4'-methylimidazolyl-(1)']ethyl-s-triazine, 2-methylimidazoline, 2-methyl-4-ethylimidazoline, 2-phenylimidazoline, 1-benzyl-2-methylimidazone, 2-phenyl-4-methyl-5-hydroxymethylimidazoline, 2,4,-diamino-6[2'-methylimidazolyl-(1)']ethyl-s-triazine, 2,4-diamino-6[2'-methyl-4'-ethylimidazolyl-(1)']ethyl-s-triazine, 1-cyano-ethyl-2-methylimidazoline, 1-cyanoethyl-2-methyl-4-ethyl-imidazoline.

7. A method for cleaning a mold comprising the steps of:
   (a) inserting a mold-cleaning sheet comprising a fibrous base material sheet and an uncured rubber composition comprising an uncured rubber and a curing agent formed on at least one surface of the fibrous base material sheet between the molding surfaces of a mold;
   (b) heating and pressing the cleaning sheet to cure the sheet; and
   (c) removing the cured sheet from the molding surfaces of the mold,
   wherein the cleaning sheet further contains a removal aid selected from the group consisting of imidazoles and imidazolines,
   wherein said imidazole is represented by formula (2) and said imidazoline is represented by formula (3):

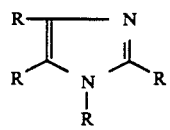

(2)

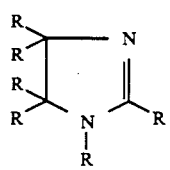

(3)

wherein R represents a hydrogen atom or a hydrocarbon group having less, than 11 carbon atoms which may have a substituent, and said R's may be the same or different.

8. A method for cleaning a mold as claimed in claim 7, wherein the curing agent contains a peroxy ketal represented by formula (1)

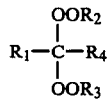

(1)

wherein $R_1$, $R_2$, $R_3$, and $R_4$, which may be the same or different, each represents a hydrogen or a monovalent hydrocarbon group.

9. A method for cleaning a mold as claimed in claim 7, wherein from 1 to 10 parts by weight of the curing agent is compounded per 100 parts by weight of the uncured rubber.

10. A method for cleaning a mold as claimed in claim 7, wherein the thickness of the sheet is from 0.2 to 1.0 mm.

11. A method for cleaning a mold as claimed in claim 7, wherein the cleaning sheet further contains a mold releasing agent.

12. A method for cleaning a mold as claimed in claim 7, wherein said imidazoles and imidazolines are selected from the group consisting of 2-methylimidazole, 2-ethyl-4-methylimidazole, 2-phenylimidazole, 1-benzyl-2-methylimidazole, 2,4-diamino-6[2'-methylimidazolyl-(1)']ethyl-s-triazine, 2-4-diamino-6[2'-ethyl-4'-methylimidazolyl-(1)']ethyl-s-triazine, 2-methylimidazoline, 2-methyl-4-ethylimidazoline, 2-phenylimidazoline, 1-benzyl-2-methylimidazoline, 2-phenyl-4-methyl-5-hydroxymethylimidazoline, 2,4,-diamino-6[2'-methylimidazolyl-(1)']ethyl-s-triazine, 2,4-diamino-6[2'-methyl-4'-ethylimidazolyl-(1)']ethyl-s-triazine, 1-cyano-ethyl-2-methylimidazoline, 1-cyanoethyl-2-methyl-4-ethyl-imidazoline.

* * * * *